United States Patent [19]

Schairer

[11] 4,214,251

[45] Jul. 22, 1980

[54] RADIATION-EMITTING SEMICONDUCTOR DIODE

[75] Inventor: Werner Schairer, Flein, Fed. Rep. of Germany

[73] Assignee: Licentia Patent-Verwaltungs-G.m.b.H., Frankfurt am Main, Fed. Rep. of Germany

[21] Appl. No.: 964,141

[22] Filed: Nov. 28, 1978

[30] Foreign Application Priority Data

Dec. 13, 1977 [DE] Fed. Rep. of Germany ....... 2755433

[51] Int. Cl.² .............................................. H01L 33/00
[52] U.S. Cl. ....................................... 357/17; 357/55; 357/68; 357/18

[58] Field of Search ................. 357/55, 17, 30, 68, 357/18

[56] References Cited

U.S. PATENT DOCUMENTS 3,996,492  12/1976  McGroddy .......................... 313/500

Primary Examiner—Martin H. Edlow
Attorney, Agent, or Firm—Spencer & Kaye

[57] ABSTRACT

A radiation-emitting semiconductor diode comprises a semiconductor body with a pn-junction running parallel to one of its main surfaces a groove in said semiconductor body for delimiting the pn-junction and interrupted by a web and connection means on the web for connecting an electrode within the area delimited by the groove and a connection point outside this area.

6 Claims, 3 Drawing Figures

RADIATION-EMITTING SEMICONDUCTOR DIODE

Background of the Invention

The invention relates to a radiation-emitting semiconductor diode having a pn-junction which runs parallel to a main surface of the semiconductor body.

Radiation-emitting diodes having a high radiation density and/or short switching times, as are necessary for example for optical information processing by means of glass fibres or air, require a high current density and a low barrier layer capacitance.

Summary of the Invention

It is an object of the invention to provide a radiation-emitting semiconductor diode which fulfils these conditions and which can be contacted at the same time and in simple manner.

According to the invention, there is provided a radiation-emitting semiconductor diode comprising a semiconductor body, a pn-junction running parallel to a main surface of said semiconductor body a groove defined by said semiconductor body to delimit said pn-junction, a web interrupting said groove and connection means on said web for connecting an electrode located with the area delimited by said groove and a connection point outside said area.

Further according to the invention, there is provided a radiation-emitting semiconductor diode having a pn-junction which runs parallel to a main surface of the semiconductor body, characterized in that the pn-junction is limited by a groove which is interrupted at one point by means of a web for a conductor track running on the web, and a connection is made between an electrode, located inside the region of the semiconductor surface enclosed by the groove, and a connection surface located outside the region of the semiconductor surface enclosed by the groove.

Brief Description of the Drawings

The invention will now be described in greater detail, by way of example, with reference to the drawings, in which.

Description of the Preferred Embodiment

Figure 1:
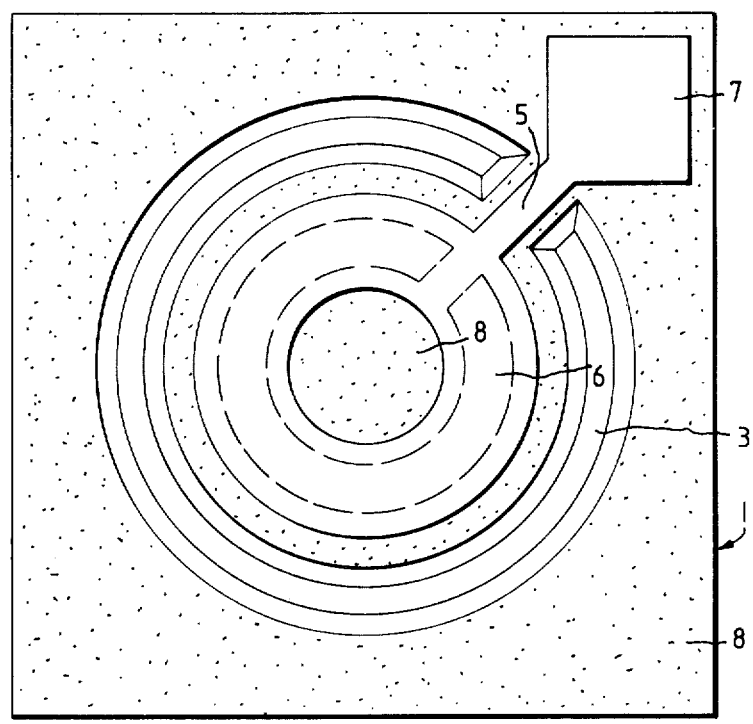
FIG. 1 shows a semiconductor diode according to the invention in plan view.
Figure 2:
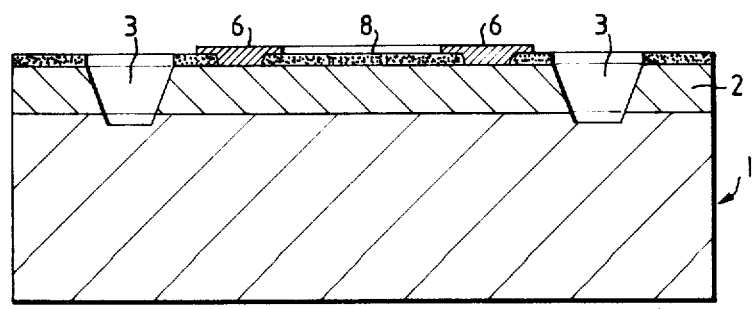
FIG. 2 shows the same diode in a sectional view.
Figure 3:
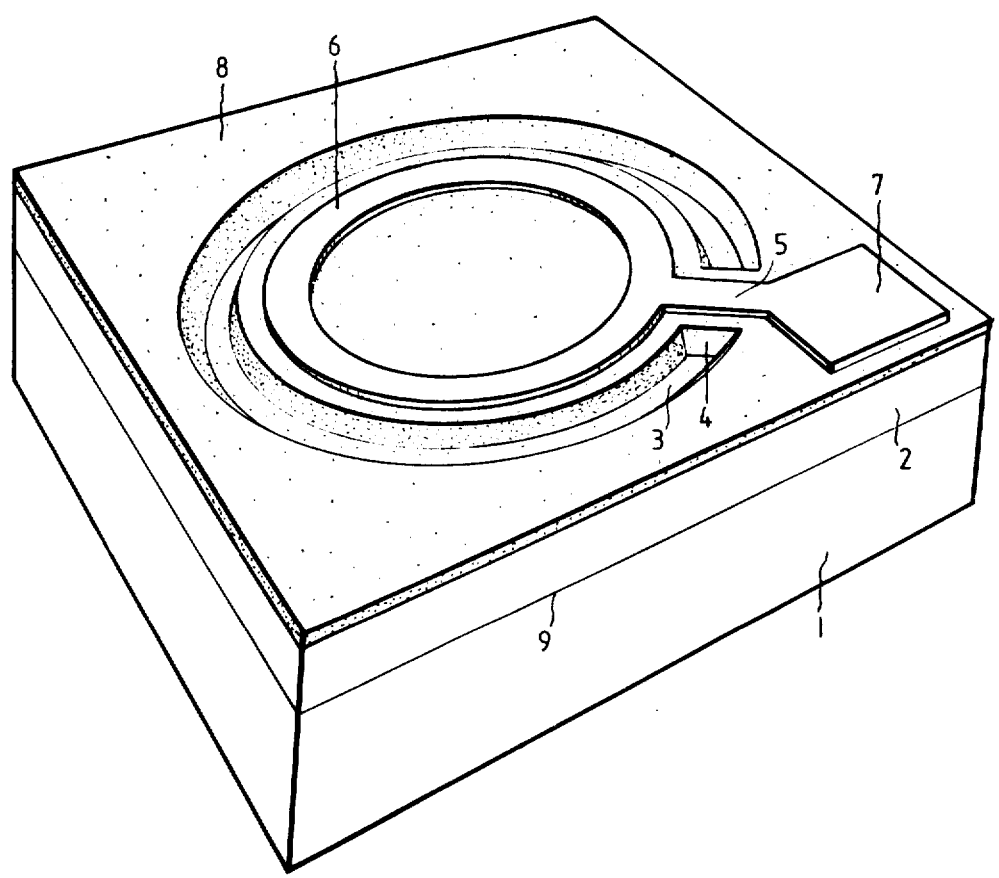
FIG. 3 shows the same diode in a perspective view.

In a preferred embodiment of the invention, in a semiconductor diode of the type mentioned at the beginning, it is proposed that the pn-junction be limited by a groove which is interrupted at one point by means of a web for a conductive track which runs on the web and makes a connection between an electrode located inside the region of the semiconductor surface encircled by the groove and a connection surface located outside the region of the semiconductor surface encircled by the groove.

Besides limiting the pn-junction, the groove has the advantageous effect of reflecting radiation emitted in one direction in the plane of the pn-junction and deflecting it in one direction approximately perpendicular to the semiconductor surface.

The semiconductor diode according to the invention is preferably provided with an insulating layer for making the semiconductor surface passive, the conductive track running on this semiconductor surface and connecting the electrode to the connection surface or to the connection area by using the web located therebetween. The electrode encircled by the groove is preferably annular or circular.

Referring now to the drawings, a radiation-emitting semiconductor diode comprises a semiconductor body 1 of the first type of conductivity into one side of which a semiconductor region 2 of the second conduction type is introduced. Production of the semiconductor region 2 takes place preferably by means of liquid phase epitaxy or gas phase epitaxy but it can also be produced by means of diffusion or by means of ion implantation.

In order to limit the semiconductor region 2 extending over the entire semiconductor body 1 in this embodiment, a groove 3 is provided which limits the semiconductor region 2 laterally so that a certain emission area or emission limitation is achieved by means of the groove limitation. The groove 3 is made by means of etching for example.

The groove 3 which is formed annularly in this embodiment is interrupted at one point so that a web 4 comprising semiconductor material is formed for a conductive track 5 which makes a connection between the electrode 6 and a connection surface or connection area 7. The conductive track 5 does not run directly on the web 4 but on an insulating layer 8 which is located on the semiconductor surface. The insulating layer 8 under the electrode 6 is partially open in the region enclosed by the groove in order to facilitate flow of current through the pn-junction limited by the groove. The insulating layer 8 comprises silicon dioxide, for example, or silicon nitride. The electrode 6 encircled by the groove 3 is annular shape in this embodiment while the connection surface 7 has a rectangular shape.

Manufacture of the radiation-emitting semiconductor diode shown takes place, for example, by covering one surface of the semiconductor body 1 of the first type of conduction over its entire surface with an epitaxial layer which belongs either completely or partially to the second type of conduction. Several epitaxial layers can also be advantageously grown so that the known structures of the hetero or double hetero junction or of the large gap emitter are formed.

In addition, the upper face of the semiconductor body provided with the pn-junction is covered by an insulating layer 8. Producing the insulating layer takes place for example by means of pyrolytic deposition of $SiO_2$. After producing the insulating layer 8, windows for the electrode 6 are etched into the insulating layer.

Producing the electrode 6 and the connection surface 7 takes place, for example, by means of evaporation and subsequent etching of the shape of the conductive track envisaged. In the case of a semiconductor body made from GaAs for example Al or Au:Zn for a p-conductive surface or Au:Ge or Sn for an n-conductive surface are suitable as metals for the electrode 6 and the connecting surface 7.

In conclusion, the groove 3 is etched into the semiconductor body such that the pn-junction extending originally through the entire semiconductor body is subdivided into two regions which are connected only be means of the web 4 for the conductive track 5. The groove 3 must be etched until it is close to the pn-junction 9 or beyond that even in order to limit the current flow effectively. Reflection of the radiation emitted in the plane of the pn-junction is effected favourably if the depth of etching extends beyond the pn-junction and if the angle of slope is approximately 45 degrees.

What is claimed is:

1. A radiation-emitting semiconductor diode having a pn-junction which runs parallel to a main surface of the semiconductor body, characterized in that the pn-junction is limited by a groove which is interrupted at one point by means of a web for a conductor track running on the web, and a connection is made between an electrode, located inside the region of the semiconductor surface enclosed by the groove, and a connection surface located outside the region of the semiconductor surface enclosed by the groove.

2. A semiconductor diode as defined in claim 1, and comprising an insulating layer for passivating said semiconductor body and on which said conductor track runs across said web.

3. A semiconductor diode as defined in claim 1, wherein said electrode is annular.

4. A semiconductor diode as defined in claim 1, wherein said electrode is circular.

5. A semiconductor diode as defined in claim 1, wherein said groove has an angle of slope of approximately 45 degrees.

6. A radiation-emitting semiconductor diode comprising a semiconductor body, a pn-junction running parallel to a main surface of said semiconductor body a groove defined by said semiconductor body to delimit said pn-junction, a web interrupting said groove and connection means on said web for connecting an electrode located with the area delimited by said groove and a connection point outside said area.

* * * * *